Figure 3:
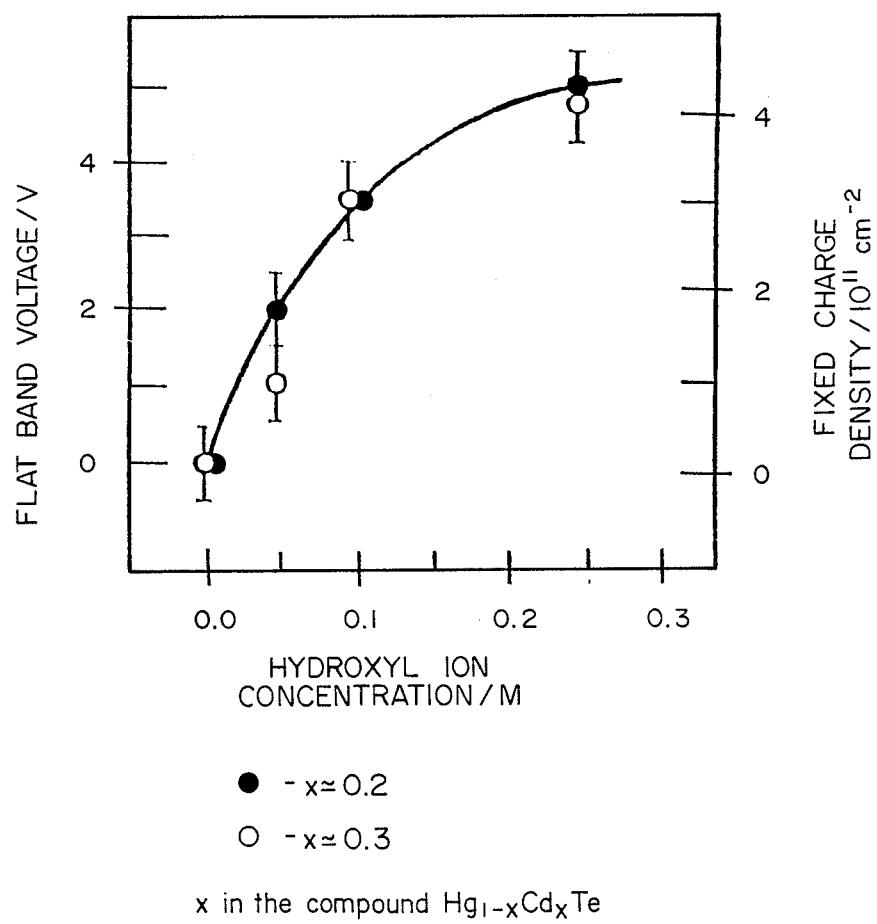

United States Patent [19]

Mainzer et al.

[11] Patent Number: 4,961,829

[45] Date of Patent: Oct. 9, 1990

[54] PASSIVATION OF SEMICONDUCTOR SURFACES

[75] Inventors: Nili Mainzer, Haifa; Eliezer Weiss, Ramat Yishay Settlement; Leah Carmiel, Kiryat Bialik, all of Israel

[73] Assignee: Semi-Conductor Devices, a Tadiran-Rafael Partnership, D. N. Misgav, Israel

[21] Appl. No.: 251,813

[22] Filed: Sep. 30, 1988

[51] Int. Cl.[5] .................. C25D 9/06; B32B 9/00
[52] U.S. Cl. .................. 204/34.5; 204/56.1; 357/52; 357/61
[58] Field of Search .............. 204/34.5, 56.1, 86, 204/128; 357/52, 61

[56] References Cited

U.S. PATENT DOCUMENTS

| | | | |
|---|---|---|---|
| 3,977,018 | 8/1976 | Catagnus et al. | 357/30 |
| 4,318,217 | 3/1982 | Jenner et al. | 29/572 |
| 4,332,880 | 6/1982 | Izu et al. | 430/272 |
| 4,441,967 | 4/1984 | Pohlmann et al. | 204/29 |
| 4,632,886 | 12/1986 | Teherani et al. | 428/698 |
| 4,696,758 | 9/1987 | Ovshinsky et al. | 252/188.31 |
| 4,726,885 | 2/1988 | Teherani et al. | 204/34.5 |
| 4,736,104 | 4/1988 | Teherani et al. | 250/370 |

*Primary Examiner*—John F. Niebling
*Assistant Examiner*—William Leader
*Attorney, Agent, or Firm*—Fleit, Jacobson, Cohn, Price, Holman & Stern

[57] ABSTRACT

A process for the passivation of the surface of certain semiconductor materials whereby there is formed a surface film. A mercury-cadmium-telluride (HgCdTe) semiconductor may be subjected to surface anodization in a bath comprising a fluoride resulting in a fluorine-containing surface film. The composition of the protective film can be varied according to the bath used in the electrochemical process for the production of the surface layer.

The invention further relates to semiconductors of the mercury cadmium telluride type passivated by the application of such surface films.

6 Claims, 7 Drawing Sheets

(a) 1MKF in 100% ethylene glycol (b) 1MKF + 0.05M KOH in 90% ethylene glycol + 10% H$_2$O FIG. I(a)
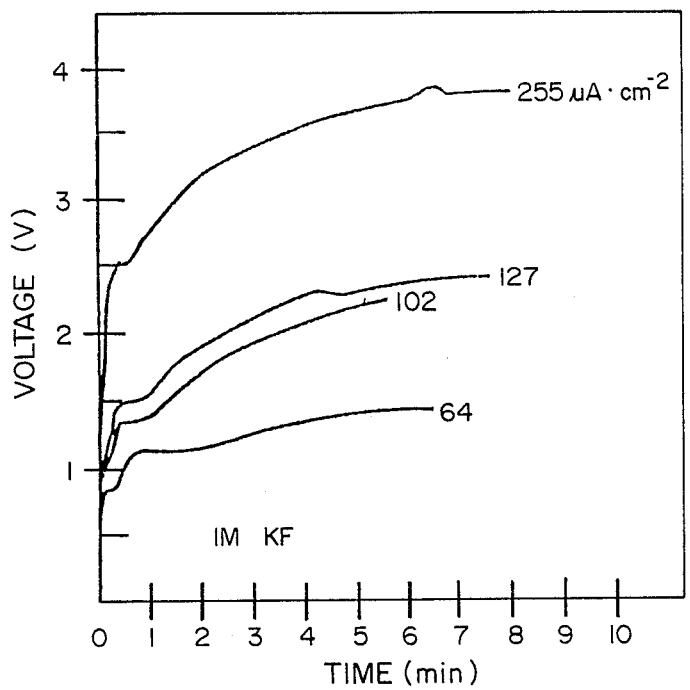
(a) IMKF in 100% ethylene glycol
FIG. I(b)
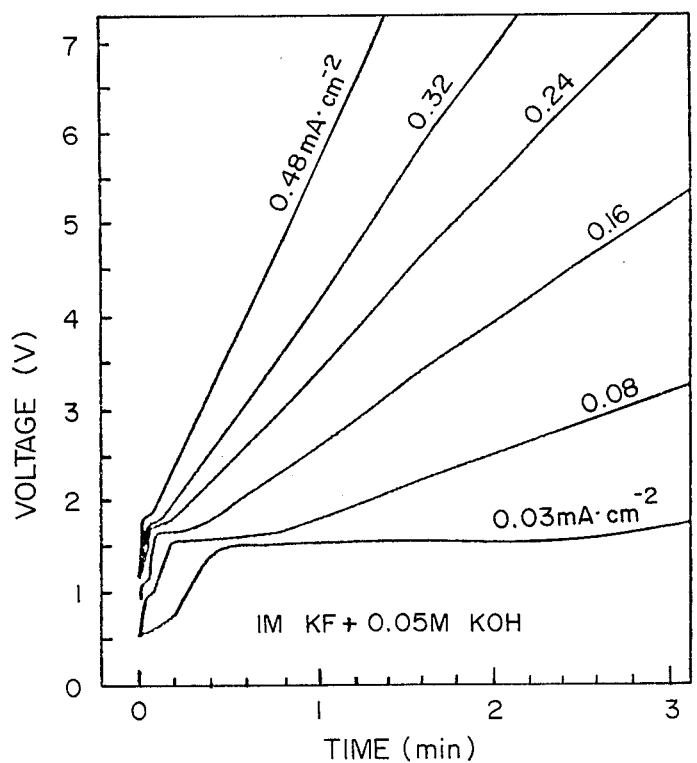
(b) IMKF + 0.05M KOH in 90% ethylene glycol + 10% $H_2O$

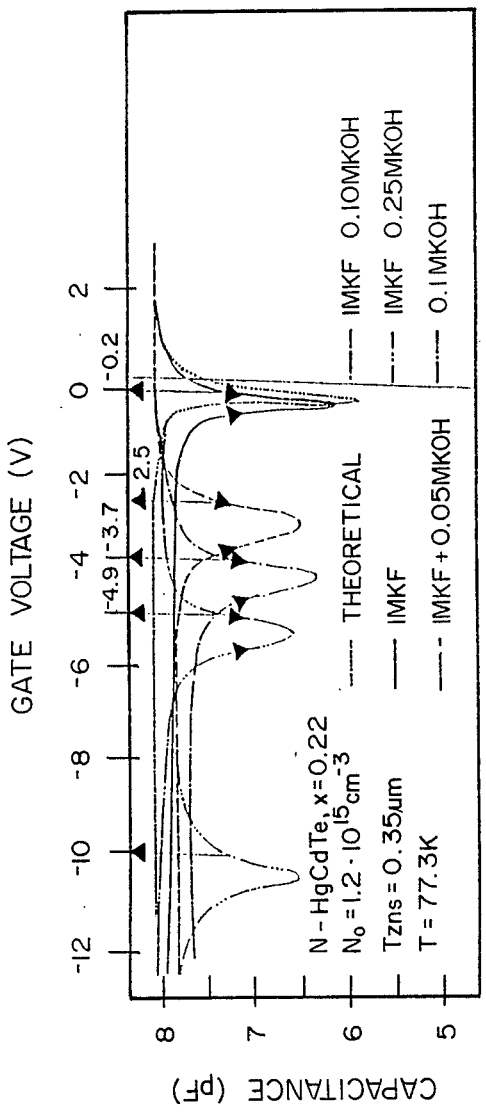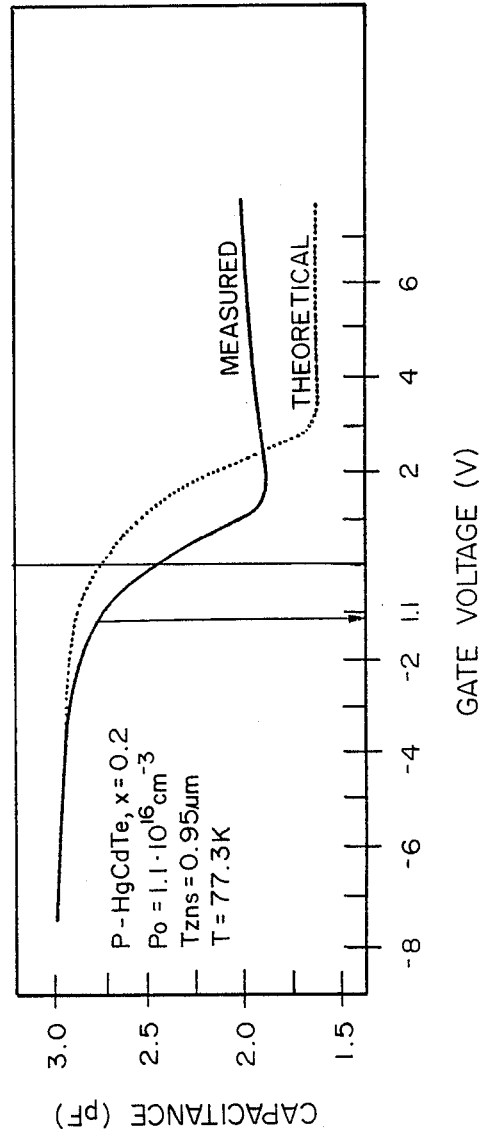

○ – photoconductors passivated with anodic oxide.
● – photoconductors passivated with anodic fluoro-oxide.

● – detectivity
○ – responsivity

PASSIVATION OF SEMICONDUCTOR SURFACES

FIELD OF THE INVENTION

The invention relates to the passivation of the surface of certain semiconductor materials, and especially of substances used in the manufacture of I.R. - detector devices by the electrochemical formation of a surface film under controlled and predetermined conditions.

The protective film is obtained by an electrochemical process, and such film is formed on the substrate from solutions containing certain fluorides. The film has a varying composition, it contains oxide and fluoride and results in a considerably improved performance of the I.R. detectors and other devices manufactured from such surface protected semi-conductors.

BACKGROUND OF THE INVENTION

Semi-conductors such as mercury cadmium telluride used in the manufacture of I.R. detection devices require surface passivation in order to avoid surface contamination and in order to improve the performance of the I.R. detector. Various attempts have been made to improve the performance of such detectors, and amongst these there may be mentioned passivation by means of deposition of a surface film, such as a film of zinc sulfide; or by means of anodic oxidation of the surface of the semi-conductor.

The main drawbacks of semi-conductors treated as above is the poor thermal stability of the semi-conductors, which is required under varying conditions, such as vacuum packaging.

Semi-conductors passivated according to the prior art, which were used in I.R. detectors resulted in a wide variance in the performance of such devices. Anodic oxides produced on the surface of mercury-cadmium telluride contain a rather large fixed positive charge, which is typically of the order of $10^{12}$ cm$^{-2}$, and this further increases upon thermal treatment at temperatures in the 60° C. to 100° C. range.

It is apparent that anodic oxides cause a strong accumulation of n-type mercury-cadium telluride (HgCdTe, for brief), and a strong inversion on p-type HgCdTe. The strong accumulation of n-type photoconductors lowers the resistance of the device and thus reduces voltage responsitivity of such devices. The inversion layer which is formed on the surface of p-type photovoltaic devices diminishes performance to essentially zero due to the formation of a conducting channel between adjacent diodes.

SUMMARY OF THE INVENTION

The invention relates to the passivation of the surface of certain semi-conductor materials, and especially of substances used in the manufacture of I.R.- detector devices by the electrochemical formation of a surface film under controlled and predetermined conditions. The protective film is obtained by an electrochemical process, and such film is formed on the substrate from solutions containing certain fluorides. The film has a varying composition, it contains oxide and fluoride and results in a considerably improved performance of the I.R. detectors and other devices manufactured from such surface-protected semi-conductor.

The process of the invention results in the effective passivation of the surface of semi-conductors such as HgCdTe, which are used in the production of I.R. radiation detectors and of other devices produced using such semi-conductors.

The process results in the formation of a fluorine containing surface film using solutions which contain a water-soluble fluoride in combination with another compound, such as an alkali metal hydroxide.

The appropriate choice of the bath makes possible predetermined variations in the composition and properties of the resulting layer. An appropriate choice of the ratio of fluoride to hydroxyl ions in the bath makes possible the adjustment of the band bending at the n-type HgCdTe surface, from near flat band conditions to strong accumulation. The process of surface film formation can be effected from aqueous solutions, from solutions of an organic solvent or from mixtures of these. Film formation on p-type HpCdTe using non-aqueous solutions results in a surface which is slightly depleted.

Photoconductive devices and detector arrays passivated according to the present invention, which have a fluorine containing surface film, have an improved thermal stability compared with such substances passivated by anodization from a bath which results in the production of an anodic oxide.

The passivation can be effected by an electrochemical process using a solution of an alkali metal fluoride, such as potassium fluoride or sodium fluoride, in combination with an alkali metal hydroxide such as potassium hydroxide or sodium hydroxide. Other suitable sources of fluorine ions or of hydroxyl ions can be used in suitable solvent systems.

There must be chosen a suitable ratio of fluoride to hydroxyl ions, and a ratio of as low as hydroxyl ions to fluorine ions of 1 to 20 gives good results. The ratio of hydroxyl ions to fluoride ions on a molar basis may vary from 1:30 to 1:10. The resulting film contains fluorine, the concentration of which differs throughout the film, maximum concentrations being at the interface with the semi-conductor and at the surface of the deposited film. The exact distribution of the fluorine depends on the concentration of the hydroxy compound in the bath.

When a film is formed using a bath which contains no alkali metal hydoxide, but only an alkali metal fluoride, such film containing a large percentage of fluorine, with the quantity of oxygen depending on the water content of the solution. When potassium fluoride is used in a non-aqueous solvent such as ethylene glycol there is obtained a film containing essentially only fluoride (anodic fluoride). When only potassium hydroxide is used there is formed an oxide film (anodic oxide). When a solution of potassium fluoride and potassium hydroxide is used, the film formed contains both oxide and fluoride (fluoro-oxide). The concentration of the alkali metal fluoride in the solution can vary within wide limits.

Experiments with potassium fluoride have shown that within the wide range of from about 0.1M KF and 5.0M KF there results no appreciable difference in the nature and composition of the resulting surface film on HgCdTe. The concentration of an alkali metal hydroxide in the bath results in a difference of composition of the surface film, as set out hereinafter.

According to the present invention there is provided a process of anodic passivation of infra-red radiation detector devices of the mercury-cadmium telluride type. The process comprises anodizing the surface of the semi-conductor in fluoridic solutions. This method provides means for producing interfaces with a low fixed positive charge density, resulting in a slightly depleted p-type mercury-cadmium telluride which is most suitable for the manufacture of photovoltaic infrared detectors.

Using this method, the band bending at the mercury-cadmium telluride-dielectric interface can be tuned by choosing an appropriate ratio of fluoride to hydroxyl ions. Thus one can adjust the degree of accumulation on n-type mercury-cadmium telluride surfaces throughout the full range from flatband conditions to strong accumulation. Hence the optimal conditions for manufacturing photoconductive and metal-insular-semi-conductor (MIS) infra-red detectors can be chosen. Low and reproducible interface state densities are achieved by high current densities. Such interfaces are stable during heat treatments at temperatures up to 100°–105° C.

The invention is illustrated with reference to the enclosed Figures in which:

FIGS. 1A–B show series of measured voltage-time curves for anodization of cadmium mercury telluride in various solutions.

FIGS. 2A–B show capacitance-voltage characteristics.

FIG. 3 illustrates the effect of hydroxyl to fluoride ions ratio on the flat band voltage of metal-insulator-semi-conductor (MIS) devices.

Figure 4A:
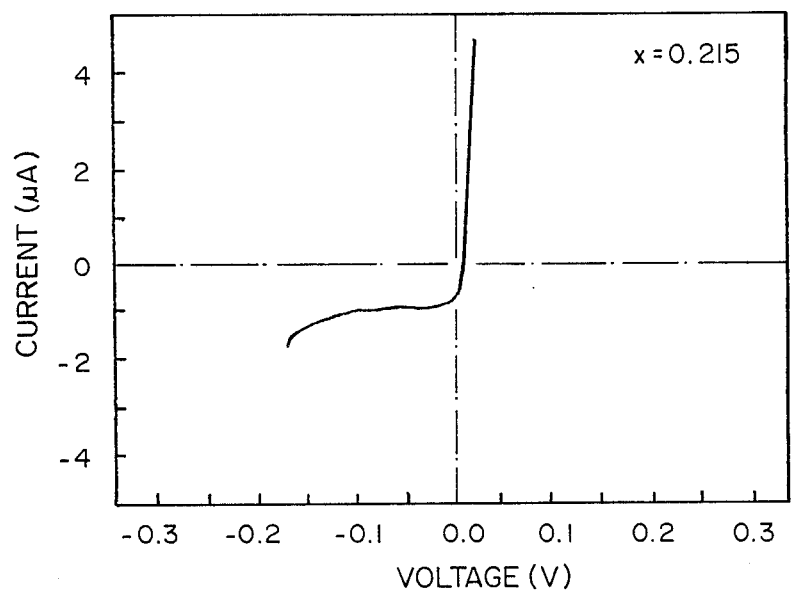
Figure 4B:
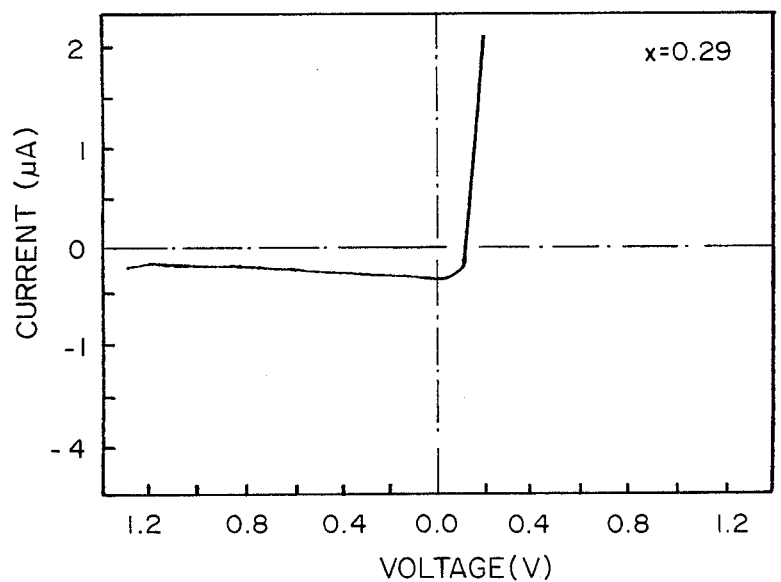

FIGS. 4A–B show current voltage characteristics for photovoltaic elements.

Figure 5A:
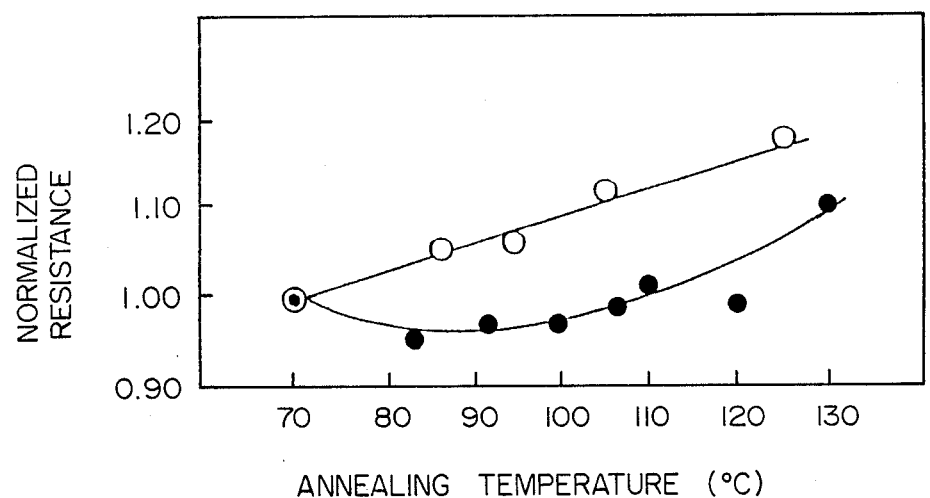
Figure 5B:
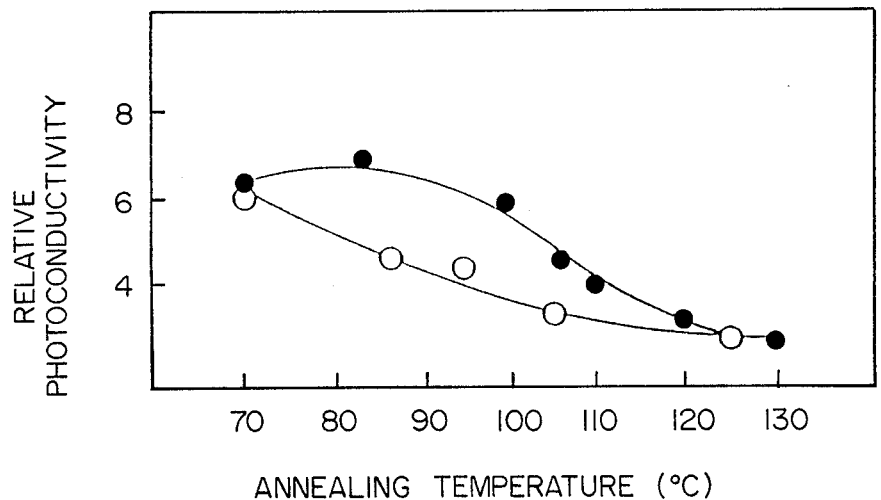

FIGS. 5A–B illustrate the effect of annealing temperature on the performance of photoconductive arrays, still in wafer form, passivated with either anodic oxide or anodic fluoro-oxide.

Figure 6A:
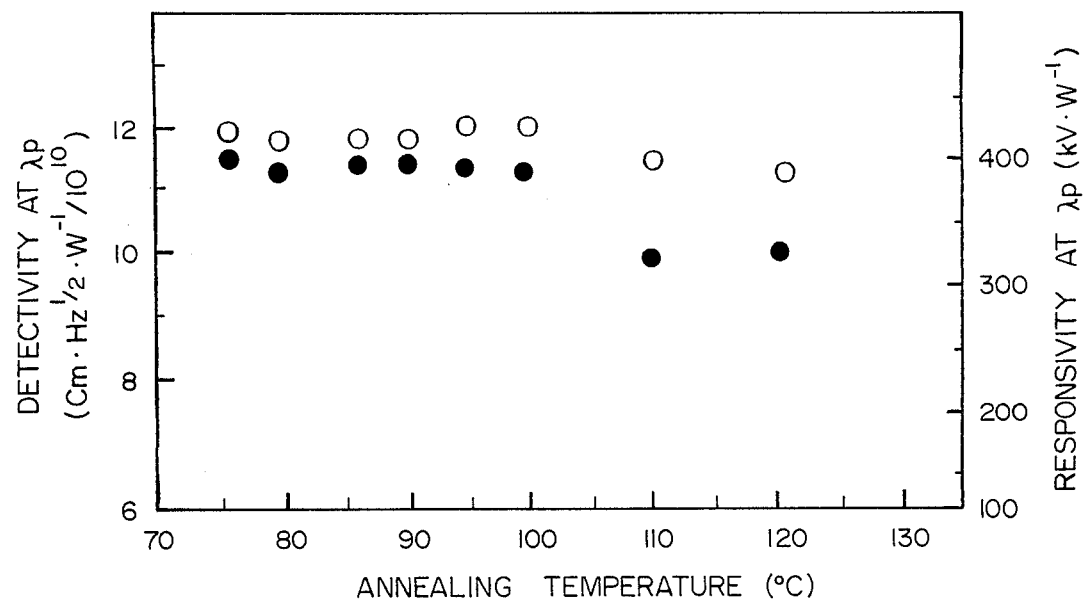
Figure 6B:
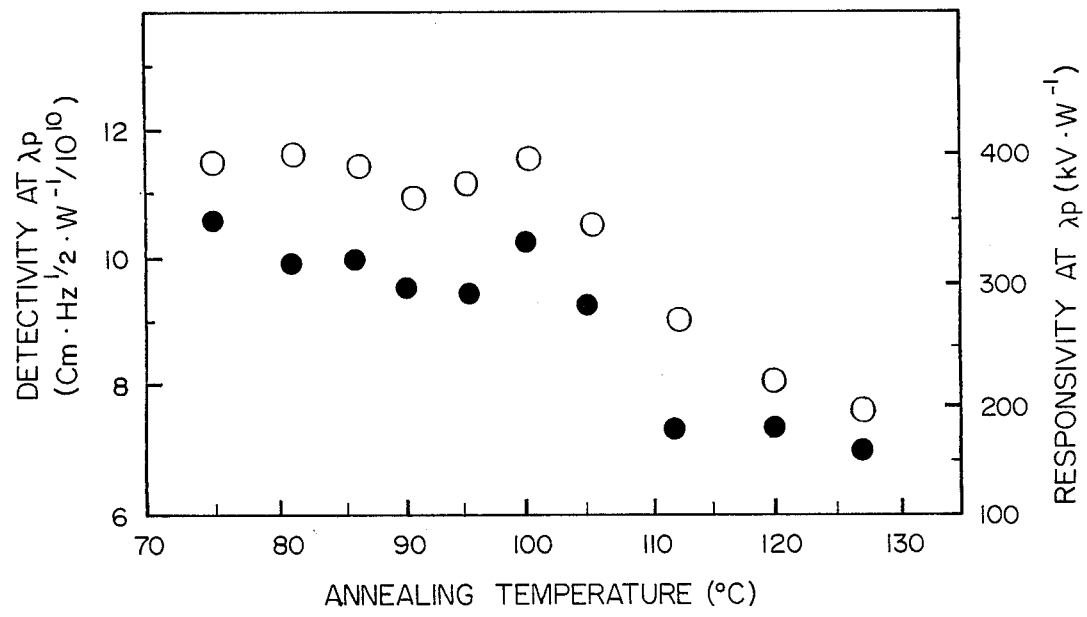
Figure 7:
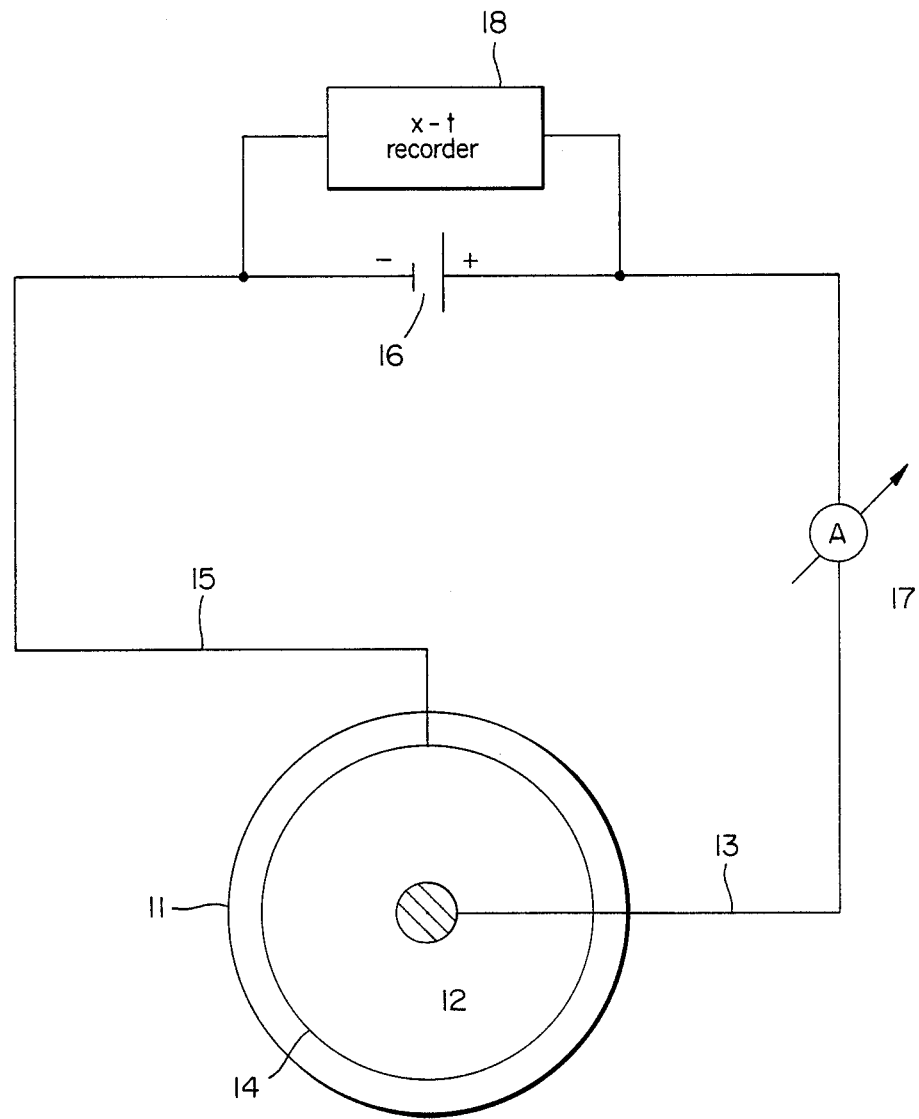

FIGS. 6A–B are a graphic representation of the effect of annealing temperature on the performance of photoconductive arrays. FIG. 7 is a schematic representation of an anodization apparatus.

Some outline experimental details of the preparation of the anodic fluoride and anodic fluoro-oxide passivations on mercury-cadmium telluride will now be given. Anodization of the lapped polished and etched surface of the semi-conductor is done in an anodizing cell where the slice is the anode and a wire serves as cathode. The anodizing solution may be one of the following solutions: 0.1 to 2 molar non-aqueous solutions of potassium fluoride in ethylene glycol, or a solution of 0.1 to 1 molar potassium fluoride and of 0.05 to 0.15 molar potassium hydroxide in 90% ethylene glycol and 10% water.

The anodization is carried out at a constant current density of 0.05 to 0.5 mA cm$^{-2}$ while recording the voltage between the anode and the cathode. End point is a gold-yellow (first cycle) color of the anodic layer.

FIG. 1 shows typical voltage-time curves for anodizations carried out in both a non-aqueous solution of KF (FIG. 1A) and an aqueous solution of KF+KOH (FIG. 1B). The anodizations of this figure were carried out beyond the normal end point.

FIG. 2 shows typical capacitance-voltage (C-V) curves of metal-incular-semi-conductor (MIS) fabricated by evaporating zinc sulfide to several thousands Angstroms onto different anodic films grown on both n-type (FIG. 2A) and p-type (FIG. 2B) mercury-cadmium telluride. The layers grown from the fluoride solutions cause low flat band voltages (shown by the vertical arrows) of −0.2 or −1.1 V for n- or p-type substrates, respectively. This is in contrast to anodic oxide which causes a much larger flat band voltage of approximately −10 V.

FIG. 2A also shows that by carefully selecting the hydroxyl to fluoride ion ratio in the anodization bath the flat band voltage can be controlled, and thus the amount of accumulation on n-type substrate can be adjusted to a predetermined value.

This is further shown in FIG. 3 for mercury-cadmium telluride substrates with compositions of either $x=0.2$ or $x=0.3$.

FIG. 4 shows current-voltage characteristics of photovoltaic elements fabricated on mercury-cadmium telluride substrates with compositions of $x=0.2$ (FIG. 4A) as well as $x=0.3$ (FIG. 4B) and passivated with the anodic fluoride.

FIGS. 5 and 6 illustrate the effect of annealing temperature on the performance of photoconductive arrays passivated with either anodic oxide or anodic fluoro-oxide. The arrays were realized on neighboring slices from the same ingot of n-type mercury-cadmium telluride with x value of 0.213. The same anodic flim was grown on both sides of each device. The photoconductors were heat treated under vacuum at variuos temperatures. Each annealing cycle lasted either 17 hours (FIG. 5) or 48 hours (FIG. 6). The same array was annealed at several elevated temperatures, yielding an accumulated annealing effect.

Fifty element arrays fabricated using either the anodic fluoro-oxidation or the anodic oxidation are compared in FIG. 5.

FIG. 5A shows that for photoconductors passivated with anodic oxide there is a monotonic increase of the resistance, measured at 77K under the photon flux of a 300K background (180° field of view). The resistance of the fluoro-oxidized photoconductors, on the other hand, remains constant up to approximately 105° C. A similar trend is seen in the photoconductivity (FIG. 5B), measured as the relative change in device resistance as a result of reducing the photon flux by approximately 30%.

There is a monotonic decrease of the photoconductivity of the devices passivated with the anodic oxide while in those passivated with the anodic fluoro-oxide, the photoconductivity remains constant unitl after annealing at temperatures of about 100° C. to 110° C.

A device for carrying out the process of the invention is shown schematically, and not according to scale in FIG. 7, in which the vessel is shown in a top view. The vessel 11 contains the semi-conductor material 12, which is connected via wire 13 as anode, and the wire 14 which is connected via 15 as cathode. These are connected to the adjustable DC constant current supply 16, where an ampere-meter 17 is provided in the circuit. The circuit comprises an x-t recorder 18. The vessel contains of course the electrolyte, which is not indicated in the Figure.

Photoconductive arrays passivated by the anodic fluoro-oxidation using various solutions were packaged with 60° field of view and evaluated by measuring responsivity and detectivity.

FIG. 6 shows the effect of annealing temperature on the responsivity at peak wavelength and the 1000K blackbody detectivity at 10 kHz of arrays passivated with fluoro-oxides grown from solutions of either 0.05 (FIG. 6A) or 0.15 (FIG. 6B) molar potassium hydroxide and 0.1 molar potassium fluoride in 90% ethylene glycol and 10% water. Shown are averages of the results of all 100 elements in each array operated at liquid nitrogen temperature. In both detectors there is little to no change in the responsivity as well as in the detectivity up to 105° C.

EXAMPLE 1

A slice of 15 mm diameter of n-type mercury-cadmium telluride, x=0.213 was introduced into a bath of 1M KF and 0.075M KOH in a 90% ethylene glycol/10% water mixture in a petri dish of 80 mm diameter and connected to a constant current supply 16, by means of metal tip 17, through amperemeter 17, by means of gold wire of 99.9999% purity and 1 mm diameter, as counter-electrode. A current of 0.5 mA was passed through the bath during 120 seconds at the end of which period there was observed a gold-yellow film (first cycle). The mercury-cadmium telluride wafer was removed from the bath, rinsed in running water and dried. The process resulted in a surface film of about 600 Å thickness consisting of a fluorine containing oxide. A photoconductive array was produced resulting in a product having improved thermal stability relative to photoconductors of the same kind passivated by formation of anodic oxide, as demonstrated by the results shown in FIG. 6.

EXAMPLE 2

A 15 mm diameter slice of p-type mercury-cadmium telluride was inserted into a bath of 1M KF in 100% ethylene glycol in a 80 mm diameter petri dish and connected to a constant current supply 16 by means of metal tips 16 through amperemeter 17 by means of gold wire of 99.999% purity and 1 mm diameter serving as cathode. A current of 0.5 mA was passed through the bath during 150 seconds resulting in a yellow colored surface film (first cycle). The wafer was removed, and rinsed in distilled water. The resulting surface film was about 600 Å thick and consisted essentially of fluorine bound to cadmium, in a matrix of HgCdTe.

An $n^+$ on photodiode was realized yielding I-V characteristics shown in FIG. 4.

We claim:

1. A process for the passivation of surfaces of semi-conductors of mercury-cadmium-telluride, which comprises subjecting such semi-conductors to surface anodization in a bath comprising a fluoride in an organic solvent or in an organic solvent/water mixture, resulting in a fluorine-containing surface film.

2. A process according to claim 1, where the solvent is selected from the group consisting of ethylene glycol, glycerol, and mixtures of water with either of these.

3. A process according to claim 1 where the bath contains a strong inorganic base.

4. A process according to claim 3, where the base is an alkali metal hydroxide.

5. A process according to claim 4, where the ratio of hydroxide to fluoride on a molar basis varies from 1:30 to 1:10.

6. A passivated HgCdTe semi-conductor for use in a radiation detector device having a surface film which contains fluorine, being the product of the process claimed in claim 1.

* * * * *